United States Patent [19]

Gärtner et al.

[11] Patent Number: 4,659,591
[45] Date of Patent: Apr. 21, 1987

[54] METHOD OF COATING TUNGSTEN PREFERENTIALLY ORIENTATED IN THE <111> DIRECTION ON A SUBSTRATE

[75] Inventors: Georg F. Gärtner, Aachen; Peter A. Janiel, Würselen, both of Fed. Rep. of Germany

[73] Assignee: U.S. Philips Corporation, New York, N.Y.

[21] Appl. No.: 798,097

[22] Filed: Nov. 14, 1985

[30] Foreign Application Priority Data

Dec. 19, 1984 [DE] Fed. Rep. of Germany ....... 3446334

[51] Int. Cl.$^4$ .............................................. C23C 16/00
[52] U.S. Cl. ...................... 427/253; 427/78; 427/255.1; 427/255.2
[58] Field of Search ................ 427/253, 255.1, 78, 427/255.2

[56] References Cited

U.S. PATENT DOCUMENTS

| | | | |
|---|---|---|---|
| 2,208,920 | 7/1940 | Allen | 427/78 |
| 3,620,838 | 11/1971 | Peehs | 427/78 |
| 3,635,760 | 1/1972 | Van Someren | 427/78 |
| 3,894,164 | 7/1975 | Dismukes et al. | 427/255.1 |
| 4,374,901 | 2/1983 | Ferrar | 427/253 |
| 4,524,297 | 6/1985 | Gartner | 313/346 |

FOREIGN PATENT DOCUMENTS 0014418  5/1978  Japan ..................................... 427/78

Primary Examiner—Norman Morgenstern
Assistant Examiner—Janyce A. Bell
Attorney, Agent, or Firm—Paul R. Miller

[57] ABSTRACT

In the reactive deposition from a gaseous phase containing tungsten hexafluoride and hydrogen on a substrate at an overall pressure of 10 to 100 hPa (low-pressure CVD method) an inert carrier gas is enriched with a rare earth metal acetyl acetonate hydrate and is conducted across the substrate and the growing tungsten layer together with the reactive gases tungsten hexafluoride and hydrogen.

13 Claims, No Drawings

METHOD OF COATING TUNGSTEN PREFERENTIALLY ORIENTATED IN THE <111> DIRECTION ON A SUBSTRATE

The invention relates to a method of manufacturing tungsten preferentially oriented in the <111> direction by reactive deposition on a substrate from a gaseous phase containing tungsten hexafluoride and hydrogen at an overall pressure of 10 to 100 hPa (low-pressure CVD method).

A method of this type is known from German Offenlegungsschrift No. 32 05 746, corresponding to U.S. Pat. No. 4,524,297, and assigned to same assignee as the present application. In this Offenlegungsschrift a method of manufacturing a thermionic cathode is described in which, inter alia, also simultaneous and alternative CVD methods of manufacturing doped tungsten layers and series of layers from tungsten and other substances are used. The Offenlegungsschrift also describes a polycrystalline tungsten coating preferentially orientated in the <111> direction which is a required condition to achieve a maximum current density of the electron emission in thoriated tungsten cathodes.

The deposition of tungsten coatings preferentially orientated in the <111> direction is effected in accordance with German Offenlegungsschrift No. 32 05 746 by adjusting the CVD parameters. The substrate temperature is, for example, approximately 500° C., the pressure in the reactor is 10 to 100 hPa, preferably 40 hPa. The WF$_6$ flow rate is, for example, approximately 30 cm$^3$/minute at an approximately tenfold H$_2$ flow rate (all flow rates Q are related to normal conditions=0° C. and 1000 hPa). In general the WF$_6$ flow rate is adjusted at such a high value that it leads just to a deposition of tungsten having a <111> texture at the relevant substrate temperature.

In the experiments which have led to the invention it was, however, found that the desired W <111> texture is not always effected in the case of the known adjustment of the CVD parameters, but in many cases only or also the W <100> texture occurs which is usual at the WF$_6$-CVD. In addition the WF$_6$ flow rate should be chosen to be so low, for example, less than 5 cm$^3$/minute that the W-deposition rates become very small resulting in the overall method lasting too long.

It is an object of the invention to provide a method of manufacturing tungsten preferentially orientated in the <111> direction in a reproducible way with acceptable deposition rates, in which method exclusively or substantially exclusively W <111> is deposited and the <100> orientation is either completely suppressed or reduced to less than 10%.

According to the invention this object is realised in that in a method of the type described in the opening paragraph an inert carrier gas is enriched with a rare earth metal acetyl acetonate hydrate and is conducted across the substrate and the growing tungsten layer together with the reactive gases tungsten hexafluoride and hydrogen.

The expressions rare earth metal and acetyl acetonate will hereinafter be abbreviated by "S.E." and "AcAc", respectively.

It is not to be expected that in the method according to the invention the W <111> growth is influenced favourably. Due to the much too low vapour pressures of the S.E.-AcAc an S.E. deposition in not detectable (<1% by weight).

Suitable inert carrier gases are, for example, helium, argon, neon, crypton, xenon and nitrogen. Argon is preferably used because it has already a relatively large mass (=atomic weight) and is therefore satisfactorily suitable as a carrier gas and is available at low cost.

Suitable S.E.-AcAc hydrates are, for example, those of La, Ce, Er, Y, Pr, Nd and Gd which have melting points of approximately 150° C. or less and are available in trihydrate form. Samarium triacetyl acetonate trihydrate is preferred because Sm(AcAc)$_3$ has a comparatively high thermal stability, low evaporation rates and is relatively inexpensive.

The share of inert carrier gas in the gaseous phase is preferably 5 to 40 Vol.% and is determined by the envisaged deposition conditions for the reactive gases. The inert gas flow rate should not be too small for the S.E.-AcAc compositions which are not very volatile, or else too little of these compositions is carried along, but on the other hand the inert gas should not be adsorbed on the substrate surface to a too large extent, or else interruptions in growth occur.

The S.E.-AcAc-hydrate share in the gaseous phase is preferably between 0.05 and 1% by weight. This range is preferred because the S.E.-AcAc is still sufficiently thermally stable up to 1% by weight and the flow rate $Q_{inert}$ is approximately in the optimum range $$0.2 \Sigma J_{\neq inert} \, Q_j \leq Q_{inert} \leq \Sigma j_{\neq inert} \, Q_j.$$

The inert carrier gas is preferably enriched with the S.E.-AcAc hydrate in a saturator whose temperature is 5° to 10° below the melting point of the S.E.-AcAc hydrate. Such a saturator has been proposed in Patent Application No. P 33 39 625.6. The saturator is filled with pulverulent S.E.-AcAc hydrate and the carrier gas flows through it.

It has also proved advantageous that a previous partial dehydration is achieved by heating the S.E.-AcAc hydrate. The partial dehydration is effectively carried out at pressure below 1 hPa and at temperatures between 100° C. and the previously mentioned saturator temperature.

The method according to the invention is also suitable for manufacturing doped tungsten layers (simultaneous CVD) and series of layers (alternative CVD).

In the simultaneous CVD method a second portion of the inert carrier gas or another inert carrier gas is enriched by a reactive compound of a dopant and conducted across the substrate and the growing tungsten layer together with the other gases. The enrichment is effectively carried out in a second saturator.

Metalorganic compounds, particularly (anhydrous) S.E. metalorganic compounds are used as reactive compounds of dopants. For the Th-doping metalorganic thorium compounds are used, preferably fluorated β-diketonates such as Th-(heptafluorine dimethyl octane dionate)$_4$ or Th-trifluoroacetyl acetonate because these compounds still have a sufficiently high vapour pressure just below the melting point at a satisfactory thermal stability. Th-doping is required for Th-W cathode materials and for the purpose of structural stabilisation.

In the alternative CVD method the supply of the carrier gas enriched with the rare earth metal acetyl acetonate hydrate and/or of the carrier gas enriched with the reactive compound of the dopant is temporarily interrupted. In practice the saturator(s) is(are) alternately blocked and then added again. The alternating layers of highly orientated material thus manufactured have the advantage that recrystallisation is greatly inhibited when the material is used at a high temperature.

Preferably the supply of the enriched carrier gas or gases is interrupted and continued for such a period that partial layers of 0.5 to 5 μm thickness are obtained. Such layers are particularly significant for high-temperature materials which have a low recrystallisation tendency and, as the case may be, a suitably oriented surface and which, when used, for example, as electrode materials, should have a satisfactory stability of form and grain structure in order to obtain a sufficient lifetime.

By means of the alternative CVD method described hereinbefore it is possible to manufacture alternating layers of <111>-W and <100>-W in a very simple and advantageous manner in which exclusively $WF_6$ is to be used as initial tungsten compound. This eliminates the difficulties that were thus far based on the fact that for the manufacture of another preferential orientation a switch-over had to be made to tungsten hexachloride as a reactive gas for which all supply leads and also the reactor had to be heated to 350° C.

The advantages of the method according to the invention can be summarized in that the <111> tungsten layers obtained by means of this method are distinguished by their fine crystallinity (grain size ≦1 μm), metallic gloss and homogeneous growth. Furthermore several dopings can also be deposited simultaneously and/or alternatingly in one single coating process with the $WF_6/H_2$ deposition parameters remaining the same. It is not necessary to use reactor external operation steps and during the process it is possible to switch between two orientations (<111> and <100>) for the $WF_6$ CVD.

The invention will further be described with reference to some examples.

In all examples the following gas flow rates were used:

Ar: 50 to 500 cm$^3$/min, preferably 150 to 180 cm$^3$/min.
$N_2$: 20 to 200 cm$^3$/min, preferably 75 to 95 cm$^3$/min.
$WF_6$: 5 to 150 cm$^3$/min, preferably 10 to 40 cm$^3$/min.
$H_2$: the 3 to 15 fold value of the $WF_6$ flow rate, preferably 60 to 400 cm$^3$/min.

The overall pressure was between 10 and 100 hPa.

Molybdenum tape was used as a substrate which was not subjected to a surface treatment. In all examples the reactive deposition was effected in a CVD reactor of high grade steel or quartz in which vacuum-tight current lead-in members were passed for direct substrate heating and which had a gas inlet and a gas outlet for draining gaseous reaction products (for example, HF). The nitrogen served as a window flushing gas, i.e. it was used to keep the observation window for the pyrometric determination of the substrate temperature free from coatings of reaction products and to prevent blurring when the reactor was preheated.

EXAMPLE 1

The following method parameters were used for an undoped W <111> deposition from $WF_6+H_2$ by means of Ar inert gas addition enriched with $Sm(AcAc)_3.xH_2O$: flow rates:

| | |
|---|---|
| Q ($WF_6$) = | 5 cm$^3$/min |
| Q ($H_2$) = | 60 cm$^3$/min |
| Q ($N_2$) = | 90 cm$^3$/min |
| Q (Ar) = | 140 cm$^3$/min |

The saturator temperature was 135° C., the saturator filling consisted of approximately 5 g of $Sm(AcAc)_3.xH_2O$. The previous saturator operation period was: 3 hours at 135° C., 4 hours at 100° C. so that a partial dehydration of the $Sm(AcAc)_3$ trihydrate was the result. Further parameters were:

overall pressure p=36 hPa;
substrate temperature T=450° to 500° C.

Under these conditions a surface share of W<111> texture of 85 to 96% was achieved, which is an optimum range for cathode uses. The rear sides of the substrates which were not directly coated were unorientated. After a still longer dehydration period and a saturator operating period a 70% <310> texture was obtained.

EXAMPLE 2

(Simultaneous CVD)

For Th-doped W <111> deposition the following experimental parameters were chosen: Q($WF_6$)=20 cm$^3$/min, Q($H_2$)=160 cm$^3$/min, Q($N_2$)=90 cm$^3$/min, $Q_{sat\ 1}$(Ar)=140 cm$^3$/min, $Q_{sat\ 2}$(AR)=100 cm$^3$/min, overall pressure $p_{ges}$=30 hPa. As in example 1 saturator 1 was filled with $Sm(AcAc)_3.xH_2O$ which was partially dehydrated for four hours at 100° C. and 0.3 hPa; its temperature was 135° C. Saturator 2 was filled with Th (heptafluorine dimethyl octane dionate)$_4$. Its temperature was 140° C. Ar flowed as carrier gas through the two saturators, each at the same flow rate of 140 cm$^3$/min. The typical coating duration for a 10 μm thick W <111> coating which contained approximately 10% by weight of $ThO_2$ was approximately 4 hours. The substrate temperature was near 580° C. As a basic coating either W <111> tungsten as described in example 1 or W <100> tungsten corresponding to the conventional $WF_6+H_2$—CVD was deposited prior to the simultaneous coating operation.

EXAMPLE 3

(Alternative CVD)

First W <100> was deposited. Saturator 1 was separated and no carrier gas was flowing. The deposition conditions were: Q($WF_6$)=50 cm$^3$min, Q($H_2$)=400 cm$^3$/min, Q($N_2$)=70 cm$^3$/min, $p_{ges}$=20 hPa, $T_{substrate}$=550° C.; the deposition duration was 5 minutes.

Subsequently there was a switch-over to W <111> deposition. For this purpose saturator 1 was added with Ar carrier gas supply and the following deposition were determined: Q($WF_6$)=20 cm$^3$/min, Q($H_2$)=160 cm$^3$/min, Q($N_2$)=70 cm$^3$/min, $Q_1$(AR)=140 cm$^3$/min, $p_{ges}$=30 hPa, $T_{substrate}$=500° C. The interval duration was 15 minutes. Subsequently the succession of interval 1 and interval 2 was repeated several times and alternating W <100> and W <111> coatings each of approximately 0.5 to 5 μm thickness were obtained.

What we claim is:

1. A method of manufacturing tugnsten oriented in the <111> direction comprising the steps of
reactively depositing tungsten hexafluoride and hydrogen from a gaseous phase at an overall pressure of 10 to 100 hPa onto a substrate, enriching an inert carrier gas with a rare earth metal acetyl acetonate hydrate, and flowing said inert carrier gas and rare earth metal acetyl acetonate hydrate across said substrate and a growing tungsten layer together with said reactive gases of tungsten hexafluoride and hydrogen.

2. A method as claimed in claim 1, characterized in that argon is used as an inert carrier gas.

3. A method as claimed in claim 1 or 2, characterized in that a samarium triacetyl acetonate trihydrate is used as a rare earth metal acetyl acetonate hydrate.

4. A method as claimed in claim 1 or 2, characterized in that the share of inert carrier gas in the gaseous phase is 5 to 40 vol. %.

5. A method as claimed in claim 1 or 2, characterized in that the share of rare earth metal acetyl acetonate hydrate in the gaseous phase is 0.05 to 1% by weight.

6. A method as claimed in claim 1, characterized in that the enrichment of the inert carrier gas with the rare earth metal acetyl acetonate hydrate is effected in a saturator whose temperature is 5° to 10° C. below the melting point of the rare earth metal acetyl acetonate hydrate.

7. A method as claimed in claim 1 or 6, characterized in that the rare earth metal acetyl acetonate hydrate is previously dehydrated partially.

8. A method as claimed in claim 1, characterized in that a second portion of the inert carrier gas or another inert carrier gas is enriched with a reactive compound of a dopant and is conducted across the substrate and the growing tungsten layer together with the other gases.

9. A method as claimed in claim 8, characterized in that a metal organic thorium compound is used as a reactive compound of the dopant.

10. A method as claimed in claim 1 or 8, characterized in that the supply of the carrier gas enriched with at least one of the rare earth metal acetyl acetonate hydrate and of the carrier gas enriched with the reactive compound of the dopant is temporarily interrupted.

11. A method as claimed in claim 10, characterized in that the supply is interrupted and continued for such a long period that partial layers of 0.5 to 5 μm thickness are obtained.

12. A method as claimed in claim 1, characterized in that said substrate is molybdenum.

13. A method as claimed in claim 4, characterized in that the share of rare earth metal acetyl acetonate hydrate in the gaseous phase is 0.05 to % by weight.

* * * * *

UNITED STATES PATENT AND TRADEMARK OFFICE
CERTIFICATE OF CORRECTION

PATENT NO. : 4.659.591

DATED : April 21. 1987

INVENTOR(S) : George F. Gartner et al

It is certified that error appears in the above-identified patent and that said Letters Patent is hereby corrected as shown below:

Column 1. line 67    change "in" to --is--

Signed and Sealed this

Twentieth Day of September, 1988

Attest:

DONALD J. QUIGG

Attesting Officer    Commissioner of Patents and Trademarks